United States Patent
Reiter et al.

(10) Patent No.: US 11,874,303 B2
(45) Date of Patent: Jan. 16, 2024

(54) POWER SEMICONDUCTOR MODULE WITH CURRENT SENSOR ROTATION BAR

(71) Applicant: Infineon Technologies AG, Neubiberg (DE)

(72) Inventors: Tomas Manuel Reiter, Munich (DE); Christoph Koch, Salzkotten (DE); Dietmar Spitzer, Völkermarkt (AT)

(73) Assignee: Infineon Technologies AG, Neubiberg (DE)

( * ) Notice: Subject to any disclaimer, the term of this patent is extended or adjusted under 35 U.S.C. 154(b) by 316 days.

(21) Appl. No.: 17/368,213

(22) Filed: Jul. 6, 2021

(65) Prior Publication Data

US 2023/0009758 A1   Jan. 12, 2023

(51) Int. Cl.
*G01R 15/20* (2006.01)
*H05K 1/18* (2006.01)
*H02M 7/00* (2006.01)

(52) U.S. Cl.
CPC ......... *G01R 15/207* (2013.01); *G01R 15/202* (2013.01); *H02M 7/003* (2013.01); *H05K 1/181* (2013.01); *H05K 2201/10151* (2013.01); *H05K 2201/10272* (2013.01)

(58) Field of Classification Search
CPC ... G01R 15/207; G01R 15/202; H02M 7/003; H05K 1/181; H05K 2201/10151; H05K 2201/10272
USPC ....................................................... 361/624
See application file for complete search history.

(56) References Cited

U.S. PATENT DOCUMENTS

| 2013/0015468 | A1* | 1/2013 | Kikuchi | H01L 23/36 257/77 |
| 2016/0104651 | A1* | 4/2016 | Asada | H01L 24/37 361/783 |
| 2017/0069561 | A1 | 3/2017 | Krugmann et al. | |
| 2020/0194542 | A1 | 6/2020 | Alapati | |
| 2021/0343620 | A1 | 11/2021 | Yao et al. | |

* cited by examiner

*Primary Examiner* — Timothy J Thompson
*Assistant Examiner* — Michael F McAllister
(74) *Attorney, Agent, or Firm* — Murphy, Bilak & Homiller, PLLC (57) ABSTRACT

A power semiconductor module includes: an electrically insulative frame having opposite mounting sides and a border wall that defines a periphery of the frame; a substrate seated in the frame; power semiconductor dies attached to the substrate; signal pins attached to the substrate and electrically connected to the power semiconductor dies; a busbar attached to the substrate and extending through the border wall; a receptacle in the border wall configured to receive a current sensor module and that exposes part of the busbar, the exposed part of the busbar having an opening; and a rotation bar jutting out from a sidewall of the receptacle and onto the exposed part of the busbar without obstructing the opening in the busbar, wherein the rotation bar forms an axis of rotation within the receptacle. A power electronic assembly that incorporates the power semiconductor module and corresponding method of production are also described.

21 Claims, 8 Drawing Sheets

POWER SEMICONDUCTOR MODULE WITH CURRENT SENSOR ROTATION BAR

BACKGROUND

Power semiconductor modules are typically attached to a printed circuit board (PCB) at one side and to a base plate at the opposite side, to form a power electronic assembly. The PCB typically includes one or more in-phase current sensors for high power drive applications, to sense each phase current delivered by the power semiconductor module to, for example, an electric motor.

One implementation of such an in-phase current sensor uses a core-based principle of magnetic current sensing. Typically, a core-based in-phase current sensor is a magnetic sensor that implements a field concentrator (e.g., an iron core wrapped around a current rail) to concentrate a magnetic field produced by a current flowing through the current rail onto a magnetic sensing element such that a measurement can be obtained. Another implementation of an in-phase current sensor uses a core-less principle of magnetic current sensing. Typically, a core-less in-phase current sensor is a magnetic sensor that implements one or more sensing elements in close proximity to a current rail such that a measurement can be obtained based on a magnetic field produced by a current flowing through the current rail as sensed by the one or more of sensing elements.

An in-phase current sensor module that uses a core-less principle of magnetic current sensing should be accurately aligned with the corresponding power busbar of the power semiconductor module, to ensure accurate current sensing. That is, the current sensor module should be symmetrically positioned relative to the centerline of the busbar. The centerline of the busbar changes for different busbar thicknesses in case one side of the busbar, typically the top side, is at a fixed mounting position. For example, thinner power busbars (e.g., 1 mm thick) are typically used for relatively low-current power semiconductor modules and thicker power busbars (e.g., 1.5 mm thick) are typically used for relatively high-current power semiconductor modules. If both busbar types have the same fixed mounting position (e.g., top side), the centerline about which the current sensor module should be symmetrically positioned depends on which thickness busbar is used. Accordingly, different current sensor modules are typically used, with a different current sensor module design for each busbar thickness. If the same current sensor module is used for busbars of different thickness but the same fixed mounting position, inaccurate current sensing would result since the current sensor module can be designed for ideal placement in only one busbar thickness case. Requiring different current sensor modules based on busbar thickness increases the risk of using the wrong current sensor module and increases tooling cost since more than one type of current sensor module must be handled during the assembly process.

Thus, there is a need for a power semiconductor module that can accommodate a single type of current sensor module regardless of power busbar thickness.

SUMMARY

According to an embodiment of a power semiconductor module, the power semiconductor module comprises: an electrically insulative frame having a first mounting side, a second mounting side opposite the first mounting side, and a border wall that defines a periphery of the electrically insulative frame; a first substrate seated in the electrically insulative frame; a plurality of power semiconductor dies attached to the first substrate; a plurality of signal pins attached to the first substrate and electrically connected to the power semiconductor dies; a busbar attached to the first substrate and extending through the border wall; a receptacle in the border wall configured to receive a current sensor module and that exposes part of the busbar, the exposed part of the busbar having an opening; and a first rotation bar jutting out from a first sidewall of the receptacle and onto the exposed part of the busbar without obstructing the opening in the busbar, wherein the first rotation bar forms an axis of rotation within the receptacle.

According to an embodiment of a power electronic assembly, the power electronic assembly comprises: a power semiconductor module comprising an electrically insulative frame having a border wall that defines a periphery of the electrically insulative frame, a busbar extending through the border wall, a receptacle in the border wall that exposes part of the busbar, the exposed part of the busbar having an opening, and a first rotation bar jutting out from a first sidewall of the receptacle and onto the exposed part of the busbar without obstructing the opening; a metal base plate attached to a first mounting side of the power semiconductor module; a circuit board attached to a second mounting side of the power semiconductor module opposite the first mounting side; and a current sensor module seated in the receptacle in the border wall of the power semiconductor module, wherein a part of the current sensor module extends through the opening in the busbar, wherein the first rotation bar forms an axis of rotation for the current sensor module.

According to an embodiment of a method of producing a power electronic assembly, the method comprises: providing a power semiconductor module comprising an electrically insulative frame having a border wall that defines a periphery of the electrically insulative frame, a busbar extending through the border wall, a receptacle in the border wall that exposes part of the busbar, the exposed part of the busbar having an opening, and a first rotation bar jutting out from a first sidewall of the receptacle and onto the exposed part of the busbar without obstructing the opening; attaching a metal base plate to a first mounting side of the power semiconductor module; and attaching a circuit board with a current sensor module to a second mounting side of the power semiconductor module opposite the first mounting side, wherein attaching the circuit board comprises inserting the current sensor module into the receptacle in the border wall of the power semiconductor module such that a part of the current sensor module extends through the opening in the busbar, wherein the current sensor module is free to rotate about an axis of rotation formed by the first rotation bar during the inserting.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a power semiconductor module that can accommodate a single type of current sensor module regardless of busbar thickness. The electrically insulative frame of the power semiconductor module has a receptacle that exposes part of a busbar of the power semiconductor module. The receptacle is configured to receive a current sensor module. A rotation bar juts out from a sidewall of the receptacle and onto the exposed part of the busbar. The rotation bar forms an axis of rotation within the receptacle, such that the current sensor module is free to rotate about the axis of rotation formed by the rotation bar during insertion of the current sensor module into the receptacle. The rotation bar may be integrally formed as part of the electrically insulative frame of the power semiconductor module, and the thickness of the rotation bar may be selected based on the thickness of the busbar. Accordingly, power semiconductor modules having different current ratings and therefore busbars of different thicknesses may use the same type of current sensor module by adapting the rotation bar thickness during the module production process.

Described next, with reference to the figures, are exemplary embodiments of the power semiconductor module, power electronic assembly produced from the power semiconductor module and corresponding method of production.

Figure 1:
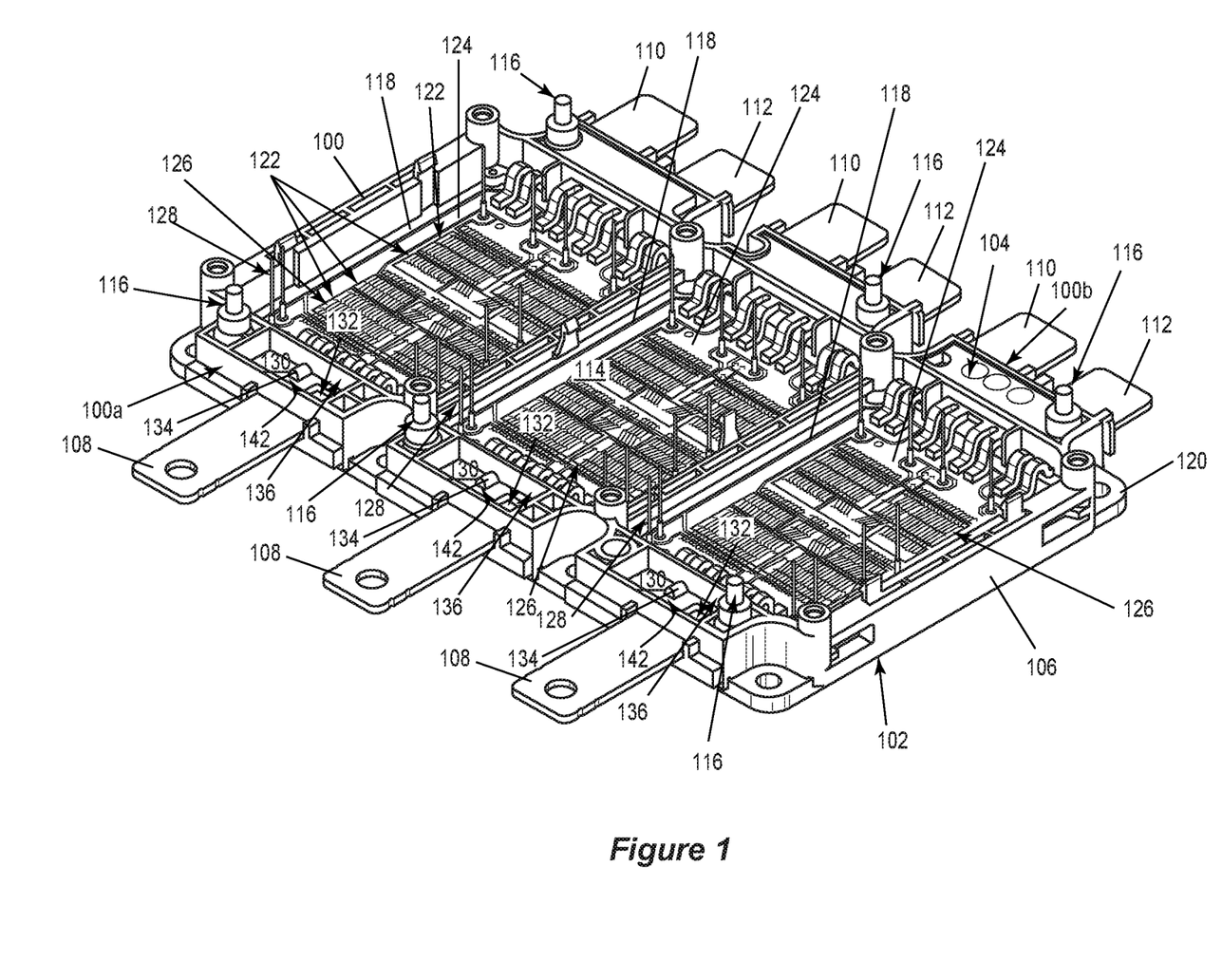
FIG. 1 illustrates a side perspective view of an embodiment of a power semiconductor module having a rotation bar feature.
Figure 2:
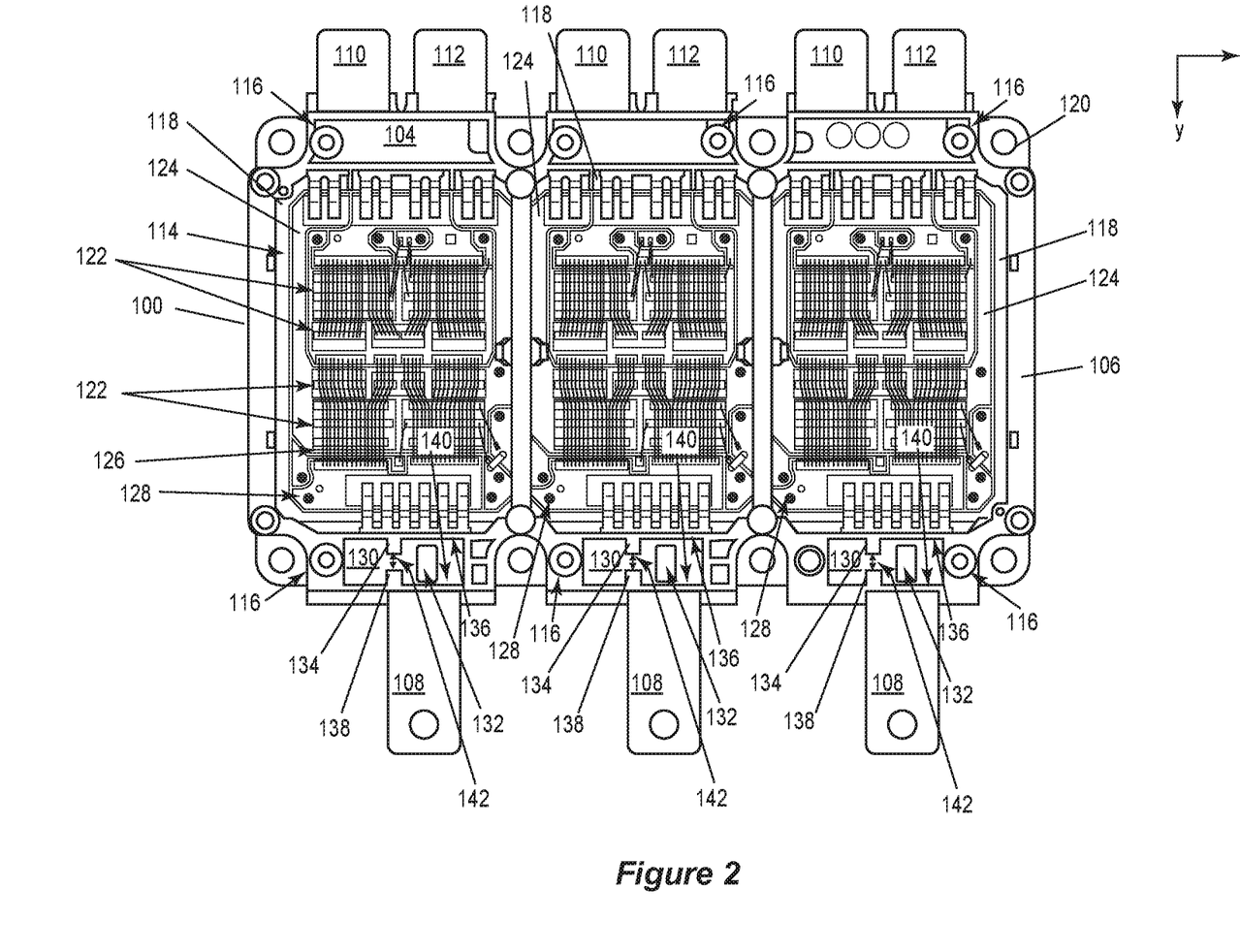
FIG. 2 illustrates a top plan view of the power semiconductor module.

FIG. 1 illustrates a side perspective view of an embodiment of a power semiconductor module. FIG. 2 illustrates a top plan view of the power semiconductor module. The power semiconductor module may be designed, e.g., for use as a DC/AC inverter, a DC/DC converter, an AC/DC converter, a DC/AC converter, an AC/AC converter, or the like.

The power semiconductor module has an electrically insulative frame 100. The electrically insulative frame 100 has a first (base plate) mounting side 102, a second (circuit board) mounting side 104 opposite the base plate mounting side 102, and a border wall 106 that defines the periphery of the electrically insulative frame 100. Busbars 108, 110, 112 extend from an interior 114 of the electrically insulative frame 100 through the border wall 106 of the electrically insulative frame 100.

Electrically insulative protrusions 116 may be formed as an integral part of the electrically insulative frame 100 and jut out from the opposite mounting side 104 of the electrically insulative frame 100 as the base plate mounting side 102. That is, the electrically insulative protrusions 116 extend or project out from the circuit board mounting side 104 of the electrically insulative frame 100. The electrically insulative protrusions 116 are configured to facilitate attachment of a circuit board such as a PCB to the power semiconductor module at the circuit board mounting side 104 of the electrically insulative frame 100. The terms 'circuit board' and 'PCB' are used interchangeably herein in referring to a board that mechanically supports and electrically connects electronic components using conductive tracks, pads and other features etched from one or more sheet layers of copper laminated onto and/or between sheet layers of a non-conductive substrate.

In one embodiment, the electrically insulative frame 100 of the power semiconductor module comprises plastic and the electrically insulative protrusions 116 are protrusions of the plastic that jut out from the circuit board mounting side 104 of the electrically insulative frame 100. For example, the plastic may be a molding compound and the electrically insulative frame 100 may be formed by injection molding, transfer molding, compression molding, film-assist molding, lamination, etc. The molding compound may comprise a wide variety of electrically insulating encapsulant materials including ceramics, epoxy materials and thermosetting plastics, to name a few. Other types of plastics may be used for the electrically insulative frame 100 of the power semiconductor module.

At least one substrate 118 is seated in the interior 114 of the electrically insulative frame 100. According to this embodiment, a metal base plate 120 is attached to the mounting side 102 of the electrically insulative frame 100 opposite the circuit board mounting side 104. In other embodiments, the power semiconductor module may be provided without the metal base plate 120 pre-attached.

In either case, each substrate 118 seated in the interior 114 of the electrically insulative frame 100 of the power semiconductor module has a plurality of power semiconductor dies 122 attached to the substrate 118. Depending on the application for which the power semiconductor module is designed, additional power semiconductor dies 122 may be attached to one or more additional substrates 118. For example, in the case of a 3-phase inverter or converter, the power semiconductor module may include 3 substrates 118 each having a plurality of power semiconductor dies 122 that are electrically connected to implement a phase of the inverter/converter. Again, the power semiconductor module may support more or fewer phases.

Each substrate 118 seated in the interior 114 of the electrically insulative frame 100 of the power semiconductor module may be a DCB (direct copper bonded) substrate, an AMB (active metal brazed) substrate, an IMS (insulated metal substrate), etc. In each case, each substrate 118 may have a patterned metallized surface 124 that provides part of the electrical interconnections between the semiconductor dies 122 of the same group. Each group of semiconductor dies 122 may be electrically interconnected, e.g., via bond wires 126 and the patterned metallized surface 124 of the corresponding substrate 118 to form, e.g., a half bridge.

In the example shown in FIGS. 1 and 2, the power semiconductor module is designed for use as a 3-phase inverter and 3 half bridges are realized by the respective groups of semiconductor dies 122. More than one semiconductor die 122 from the same group may be coupled in parallel to provide higher current handling capability. Each half bridge has a phase output that is electrically coupled to a corresponding phase busbar 108. Each phase busbar 108 extends from the corresponding substrate 118 through a side face 100a of the electrically insulative frame 100 in which each substrate 118 is seated. Respective power (voltage) and ground busbars 110, 112 extend through a different side face 100b of the electrically insulative frame 100 and provide voltage and ground, respectively, to the corresponding groups of semiconductor dies 122.

The type and number of semiconductor dies 122 attached to each substrate 118 may depend on the application for which the power semiconductor module is designed. For example, the semiconductor dies 122 may be power MOSFET (metal-oxide-semiconductor field-effect transistor) dies, HEMT (high-electron mobility transistor) dies, IGBT (insulated gate bipolar transistor) dies, power diode dies, etc.

In each case, respective signal pins 128 are attached to each substrate 118 and are electrically connected to the corresponding group of power semiconductor dies 122, e.g., via the patterned metallized surface 124 of the corresponding substrate 118 and one or more bond wires 126. The signal pins 128 provide control signalling such as gate signals to the respective groups of power semiconductor dies 122, and may provide other functionality such as telemetry signalling, error signalling, etc. According to the embodiment illustrated in FIGS. 1 and 2, the signal pins 128 of the power semiconductor module vertically extend away from the respective substrates 118.

A receptacle 130 is formed in the border wall of the electrically insulative frame 100 for each phase busbar 108 included in the power semiconductor module. Each receptacle 130 is configured to receive a current sensor module (not shown in FIGS. 1 and 2), and exposes part of the corresponding phase busbar 108 where the busbar 108 extends through the receptacle 130. The exposed part of each phase busbar 108 has an opening 132 for receiving part of the corresponding current sensor module.

A first rotation bar 134 juts out from a first sidewall 136 of each receptacle 130 and onto the exposed part of the corresponding phase busbar 108 without obstructing the opening 132 in the phase busbar 108. Each first rotation bar 134 forms an axis of rotation within the corresponding receptacle 130, e.g., along the y-direction in FIG. 2. The rotation bar 134 may take the form of, for example, a portion of a sphere (e.g., a half-sphere), a portion of a cylinder (e.g., a half-cylinder), or another type of rounded or angled surface protrusion that enables tilting of a current sensor module with respect to the busbar 108.

According to the embodiment illustrated in FIGS. 1 and 2, a second rotation bar 138 juts out from a second sidewall 140 of each receptacle 130 opposite the first sidewall 136, and onto the exposed part of the corresponding phase busbar 108 without obstructing the opening 132 in the phase busbar 108. The first rotation bar 134 and the second rotation bar 138 in each receptacle 130 are aligned with one another, e.g., along the y-direction in FIG. 2.

A gap 142 is present between the first rotation bar 134 and the second rotation bar 138 in each receptacle 130, and the second rotation bar 138 forms part of the same axis of rotation as the first rotation bar 134 in the same receptacle 130. The gap 142 between the first rotation bar 134 and the second rotation bar 138 in each receptacle 130 may be in a range of 1 mm to 4 mm, for example. The size of each gap 142 may be expressed in terms of the distance between the first sidewall 136 and the second sidewall 140 of the receptacles 130. For example, the gap 142 between the first rotation bar 134 and the second rotation bar 138 in each receptacle 130 may be in a range of 13% to 52% of the distance between the first sidewall 136 and the second sidewall 140 of the receptacle 130.

As previously explained herein, the electrically insulative frame 100 of the power semiconductor module may be made of plastic, e.g., by injection molding, transfer molding, compression molding, film-assist molding, lamination, etc. The rotation bars 134, 138 may be formed by a correspondingly shaped mold die used during the plastic molding process. In the case of a molded electrically insulative frame 100 that comprises plastic, the first rotation bar 134 is a protrusion of the plastic jutting out from the first sidewall 136 of the corresponding receptacle 130 and the second rotation bar 138 (if used) is a protrusion of the plastic jutting out from the second sidewall 140 of the receptacle 130.

Figure 3:
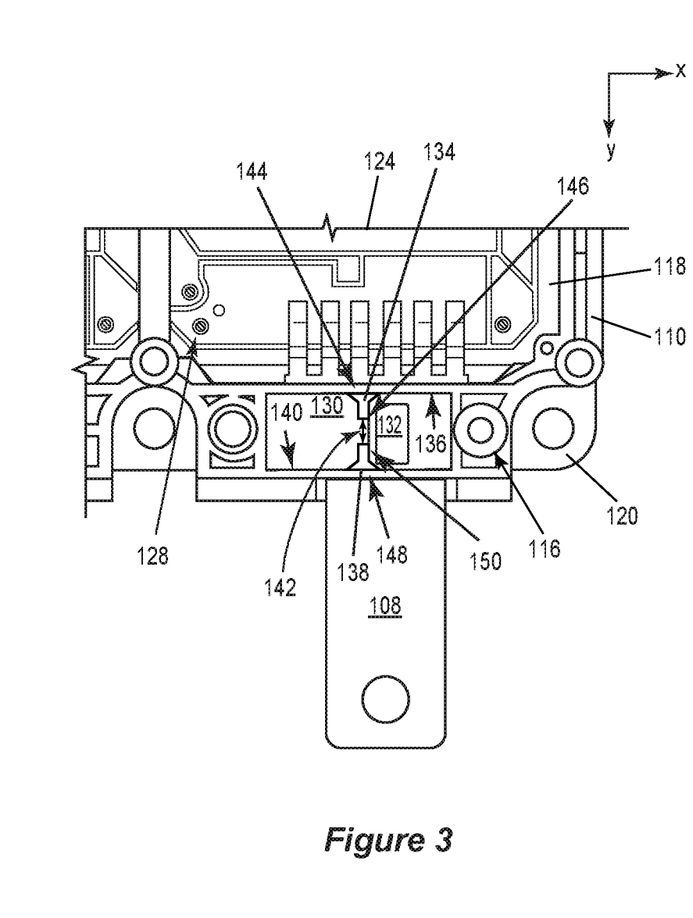
FIG. 3 illustrates a partial top plan view of the power semiconductor module in the region of one current sensor module receptacle, according to another rotation bar embodiment.
Figure 4:
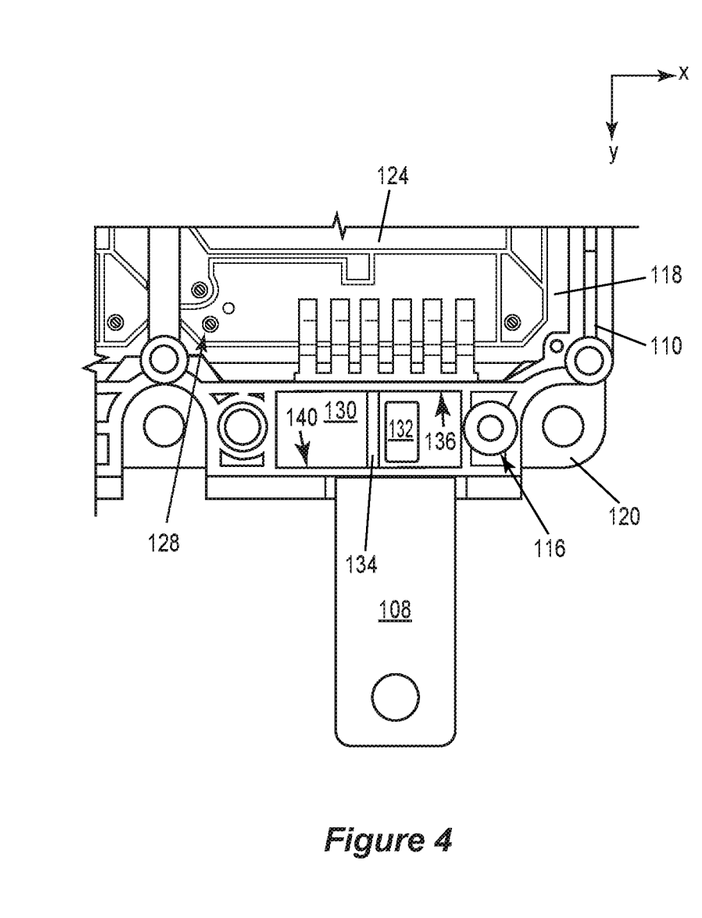
FIG. 4 illustrates a partial top plan view of the power semiconductor module in the region of one current sensor module receptacle, according to another rotation bar embodiment.

FIGS. 3 and 4 illustrate respective partial top plan views of the power semiconductor module in the region of one receptacle 130, according to further rotation bar embodiments.

In FIG. 3, the first rotation bar 134 has a proximal end 144 adjoining the first sidewall 136 of the receptacle 130 and a distal end 146 facing the second rotation bar 138. Similarly, the second rotation bar 138 has a proximal end 148 adjoining the second sidewall 140 of the receptacle 130 and a distal end 150 facing the first rotation bar 134. According to the embodiment illustrated in FIG. 3, the proximal end 144 of the first rotation bar 134 is wider in the x-direction than the distal end 146 of the first rotation bar 134 and the proximal end 148 of the second rotation bar 138 is wider in the x-direction than the distal end 150 of the second rotation bar 138.

In FIG. 4, the first rotation bar 134 extends to the second sidewall 140 of the receptacle 130 opposite the first sidewall 136. According to the embodiment illustrated in FIG. 4, the first rotation bar 134 is uninterrupted between the first sidewall 136 and the second sidewall 140 of the receptacle 130.

Figure 5:
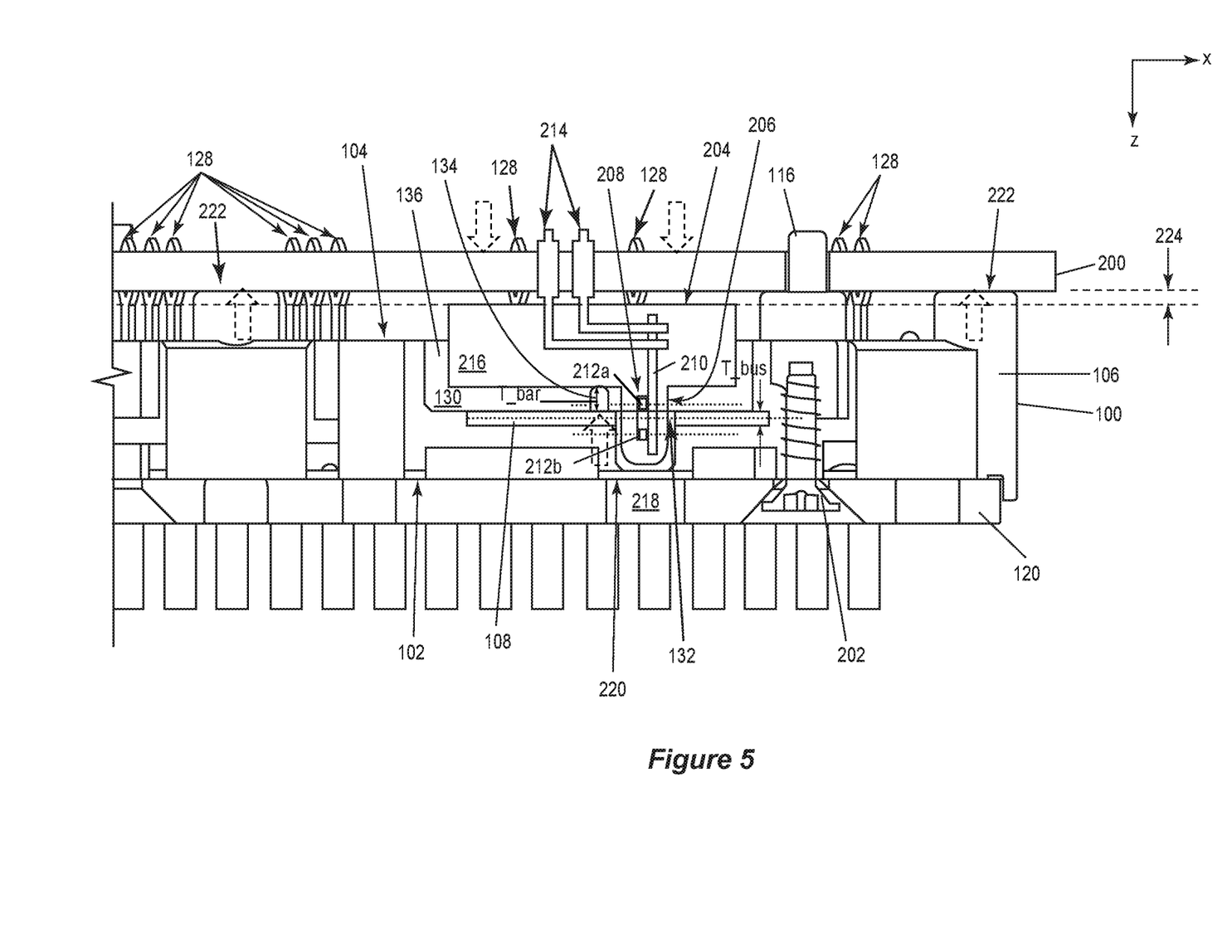
FIG. 5 illustrates a partial cross-sectional view of an embodiment of a power electronic assembly that includes a power semiconductor module with a rotation bar feature.

FIG. 5 illustrates a partial cross-sectional view of an embodiment of a power electronic assembly that includes a power semiconductor module with one or more of the rotation bar features described herein. Accordingly, each receptacle 130 formed in the border wall 106 of the electrically insulative frame 100 of the power semiconductor module includes at least the first rotation bar 134 which juts out from the first sidewall 136 of the receptacle 130 and onto the exposed part of the corresponding phase busbar 108 without obstructing the opening 132 in the busbar 108. As described above, the power electronic assembly may be a DC/AC inverter, a DC/DC converter, an AC/DC converter, a DC/AC converter, an AC/AC converter, or the like.

A metal base plate 120 is attached to the first mounting side 102 of the power semiconductor module and a circuit board 200 is attached to the second mounting side 104 of the power semiconductor module opposite the first mounting side 102. The metal base plate 120 may be a metal block, fined, water-cooled, etc. Fasteners 202 such as screws may be used to attach the metal base plate 120 to the power semiconductor module.

The circuit board 200 is attached to the opposite mounting side 102 of the power semiconductor module as the metal base plate 120. The circuit board 200 may be a single-layer or multi-layer PCB, for example. Components such as semiconductor dies, resistors, capacitors, etc. may be attached to one or both main sides of the circuit board 200. For example, control circuitry such as a microcontroller, etc. may be attached to the circuit board 200 for controlling the switching state of the power semiconductor dies 122 included in the power semiconductor module.

A current sensor module 204 is seated in each receptacle 130 formed in the border wall 106 of the power semiconductor module. A part 206 of the current sensor module 204 extends through the opening 132 in the corresponding phase busbar 108. At least the first rotation bar 134 forms an axis of rotation for the current sensor module 204. A second rotation bar 138 may form part of the axis of rotation in each receptacle 130, as previously explained herein. In each case, the axis of rotation allows the current sensor module 204 to pivot at least in one direction during the assembly process, thereby accommodating alignment tolerances associated with the current sensor module 204 and circuit board 200.

Each current sensor module 204 includes a current sensor 208 such as a differential Hall sensor attached to a circuit board 210. Each current sensor module 204 may sense relatively high current, e.g., 500 A or more and may have two (2) Hall sensors 212a, 212b for measuring the magnetic field surrounding the corresponding phase busbar 108 via differential Hall sensing. Connector pins (terminals) 214 extend away from the circuit board 210 to provide a point of external electrical connection for the current sensor 208. In one embodiment, the current sensor 208 includes a bare semiconductor die (chip) encased in a molding compound 216, the die including a differential sensor circuit such as a differential Hall sensor circuit. The current sensor 208 may be a surface mount device (SMD) without being subjected to an over-molding process. The current sensor 208 may use a core-less principle of magnetic current sensing.

The metal base plate 120 attached to the first mounting side 102 of the power semiconductor module may include an opening 218 vertically aligned with each current sensor receptacle 130 formed in the border wall 106 of the power module frame 100. The metal base plate 120 may be grounded and comprise a metal or metal alloy. Metal material can distort the magnetic fields sensed by the current sensors 208. By forming openings 218 in the metal base plate 120 that are vertically aligned with the current sensor receptacles 130, less metal material is available to distort the magnetic fields. The openings 218 in the metal base plate 120 that are vertically aligned with the current sensor receptacles 130 may have any form such as but not limited to round holes, rectangular cut-outs, etc. Each receptacle 130 in the border wall 106 of the power module frame 100 and configured to receive a current sensor module 204 may have a solid bottom 220 that is formed by part of the electrically insulative frame 100 and exposed by the corresponding opening 218 in the metal base plate 120.

Regardless of the type of current sensor modules 204 used, the thickness 'T_bar' of the first rotation bar 134 (and second rotation bar 138, if used) in the assembly direction (z-direction in FIG. 5) may be selected to ensure proper positioning of the current sensor 208 included in each current sensor module 204. Otherwise, stray fields may degrade performance of the current sensors 208, which may be particularly problematic if the current sensor 208 uses a core-less principle of magnetic current sensing.

In the case of differential Hall sensing, the current sensor module 204 may contact the corresponding first rotation bar 134 (and second rotation bar 138, if used) and the thickness T_bar of the first rotation bar 134 (and second rotation bar 138, if used) may be proportional to the thickness 'T_bus' of the corresponding phase busbar 108 such that the first Hall sensor 212a is positioned above the phase busbar 108 and the second Hall sensor 212b is positioned below the phase busbar 108, as indicated by the horizontal dotted lines in FIG. 5. For example, the first rotation bar 134 (and second rotation bar 138, if used) may be designed thinner for thicker busbars 108 (e.g., 1.5 mm thick busbar) and thicker for thinner busbars 108 (e.g., 1 mm thick busbar).

If a molding process is used to form the electrically insulative frame 100 of the power semiconductor module, a mold die may be designed to yield an appropriate thickness for the first rotation bar 134 (and second rotation bar 138, if used) relative to the thickness of the corresponding phase busbar 108. This way, power semiconductor modules with different busbar thicknesses may be produced without requiring a different current sensor module design for each unique busbar thickness. Also, the same tooling may be used to produce power electronic assemblies from the power semiconductor modules with different busbar thicknesses. In one embodiment, the thickness T_bar of the first rotation bar 134 (and second rotation bar 138, if used) is in a range of 0.7 mm to 4 mm. Such a thickness range allows for accommodating thicker (e.g., 1.5 mm thick) phase busbars 108 for higher-current applications and thinner (e.g., 1 mm thick) phase busbars 108 for lower-current applications.

During the assembly process, a pressing tool (not shown) applies a pressing force to the circuit board 200. The pressing force is indicated in FIG. 5 by the downward facing dashed arrows. In the case of press-fit pins as the signal pins 128 of the power semiconductor module and the pins 214 of the current sensor modules 204, the pressing force exerted by the pressing tool ensures a press-fit connection between the circuit board 200 and the power semiconductor module. A counterforce is applied by each first rotation bar 134 (and second rotation bar 138, if used) and by a hard stop 222 of the electrically insulative protrusions 116 of the power semiconductor module. The counterforce is indicated in FIG. 5 by the upward facing dashed arrows. The design of the sensor body 216 may ensure a certain remaining air gap 224 between the circuit board 200 and the first mounting side 102 of the power semiconductor module after the press-in process. Otherwise, tolerances may lead to deformation of the circuit board 200 in the pressing direction (z-direction in FIG. 5) which may lead to circuit board strain and cracking of strain-sensitive components such as multi-layer ceramic capacitors attached to the circuit board 200.

Figure 6:
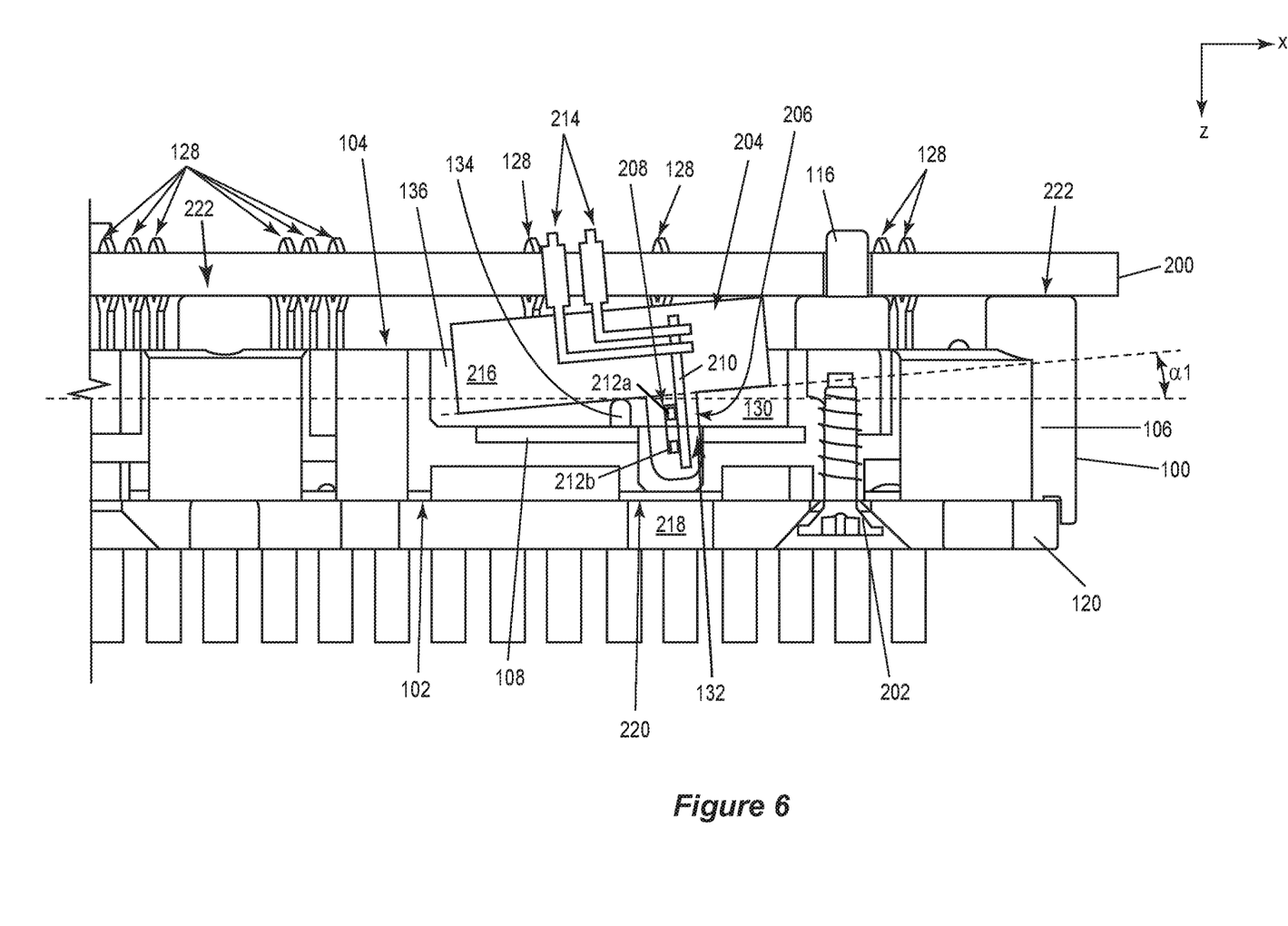
FIGS. 6 and 7 illustrate inserting of a current sensor module into a corresponding receptacle formed in a border wall of a power semiconductor module, where the current sensor module is inserted at different angles.
Figure 7:
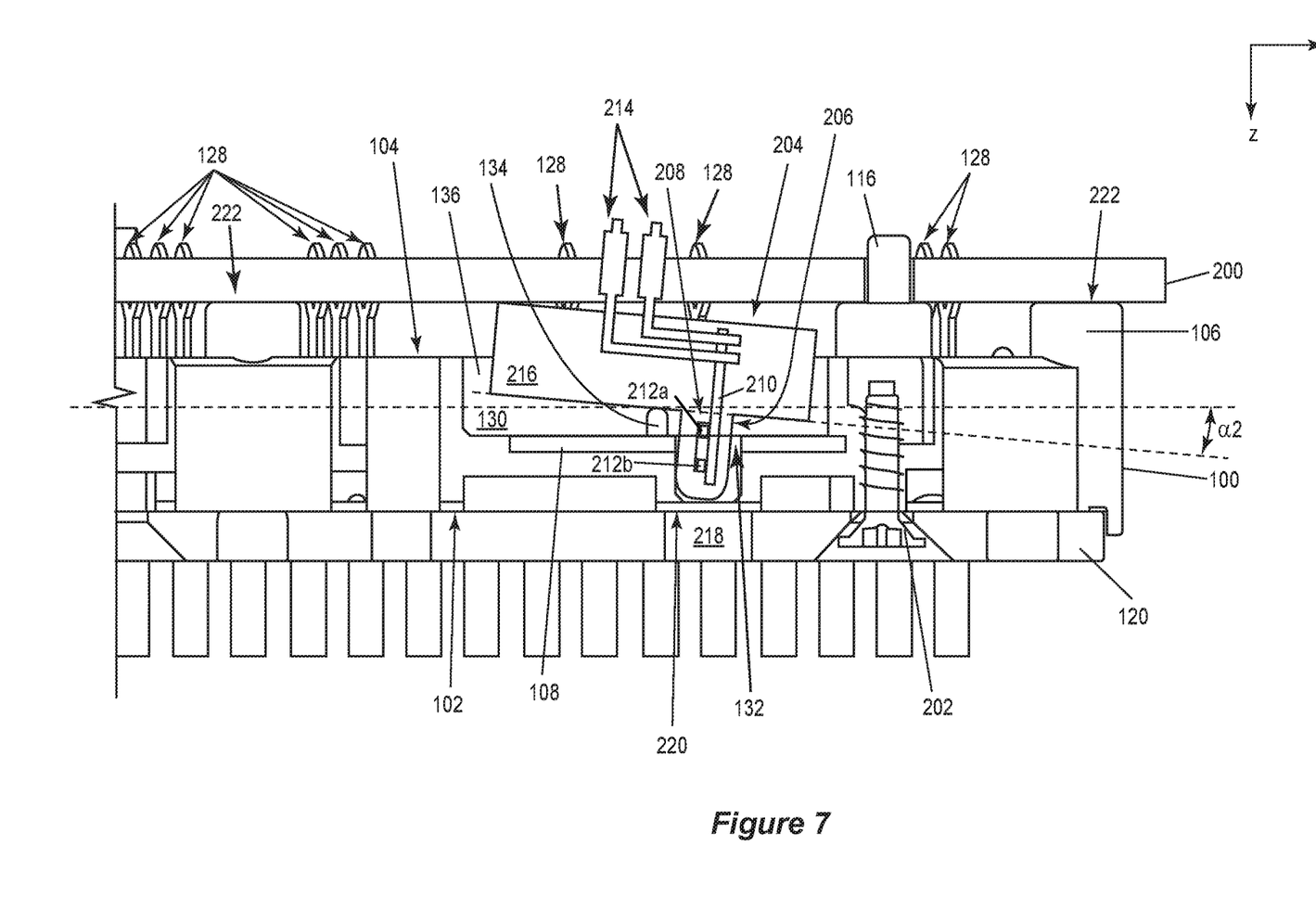

FIGS. 6 and 7 illustrate the inserting of a current sensor module 204 into the corresponding receptacle 130 formed in the border wall 106 of the power semiconductor module. As the current sensor module 204 is inserted into the corresponding receptacle 130 of the power semiconductor module, the part 206 of the current sensor module 204 with the current sensor 208 extends through the opening 132 in the phase busbar 108 to ensure proper positioning of the current sensor 208 relative to the phase busbar 108. In the case of differential Hall sensing, a first Hall sensor 212a of the current sensor 208 is positioned above the phase busbar 108 and a second Hall sensor 212b of the current sensor 208 is positioned below the phase busbar 108.

In FIG. 6, the current sensor module 204 is tilted at a first angle α1 relative to the main horizontal plane of the circuit board 200 as indicated by the dashed lines. The offset may be due to assembly tolerances during attachment of the current sensor module 204 to the circuit board 200. When the current sensor module 204 contacts the first rotation bar 134 (and second rotation bar 138, if used) in the corresponding receptacle 130 of the power semiconductor module, the current sensor module 204 is free to rotate about the axis of rotation formed by the first rotation bar 134 (and second rotation bar 138, if used) during the inserting.

In FIG. 7, the current sensor module 204 is tilted at a second angle α2 relative to the main horizontal plane of the circuit board 200 as indicated by the dashed lines. The angular tilt of the current sensor module 204 is in the opposite direction as in FIG. 6. However, in both cases, the current sensor module 204 is free to rotate about the axis of rotation formed by the first rotation bar 134 (and second rotation bar 138, if used) during the inserting. Accordingly, assembly tolerances between the current sensor module 204 and the circuit board 200 may be at least party compensated by the rotation bar feature described herein.

Figure 8:
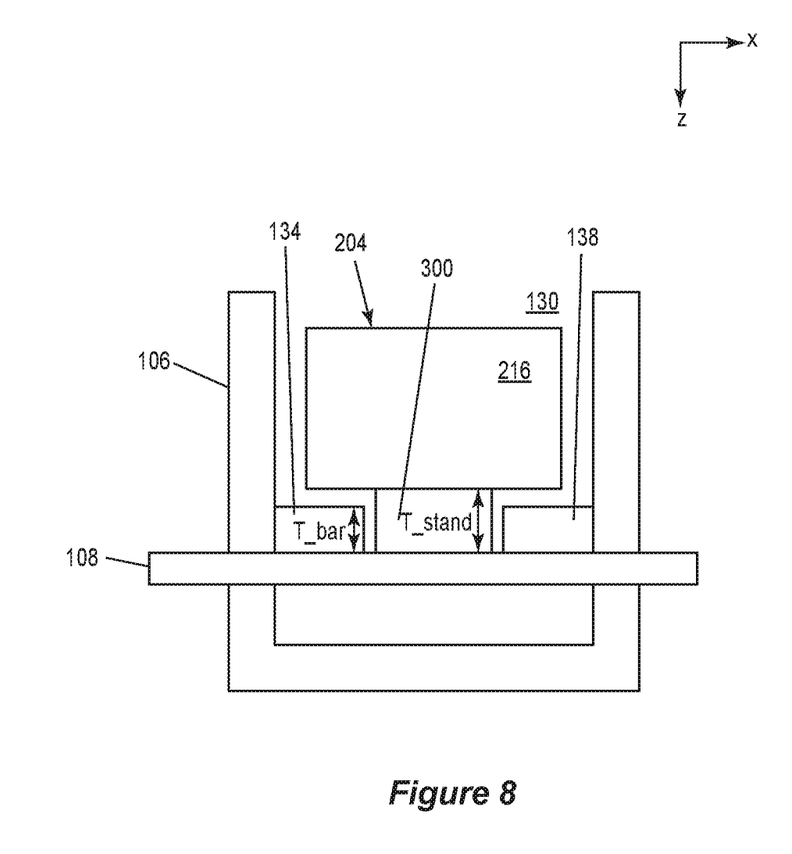
FIG. 8 illustrates a cross-sectional view of a current sensor module seated in a receptacle in a border wall of a power semiconductor module, outside a region of a phase busbar having an opening for receiving a sensor part of the current sensor module.

FIG. 8 illustrates a cross-sectional view of a current sensor module 204 seated in one receptacle 130 in the border wall 106 of the power semiconductor module, outside the region of the phase busbar 108 with the opening 132 for receiving the sensor part 206 of the current sensor module 204. According to this embodiment, the current sensor module 204 has a standoff 300 that contacts the exposed part of the phase busbar 108. The standoff 300 is thicker (T_stand >T_bar) than the first rotation bar 134 (and second rotation bar 138, if used) such that the current sensor module 204 does not contact the first rotation bar 134 (or second rotation bar 138, if used). As previously explained herein, the current sensor module 204 may not be positioned ideally during the assembly process. The standoff 300 limits the maximum vertical displacement (z-direction in FIG. 8).

Figure 9:
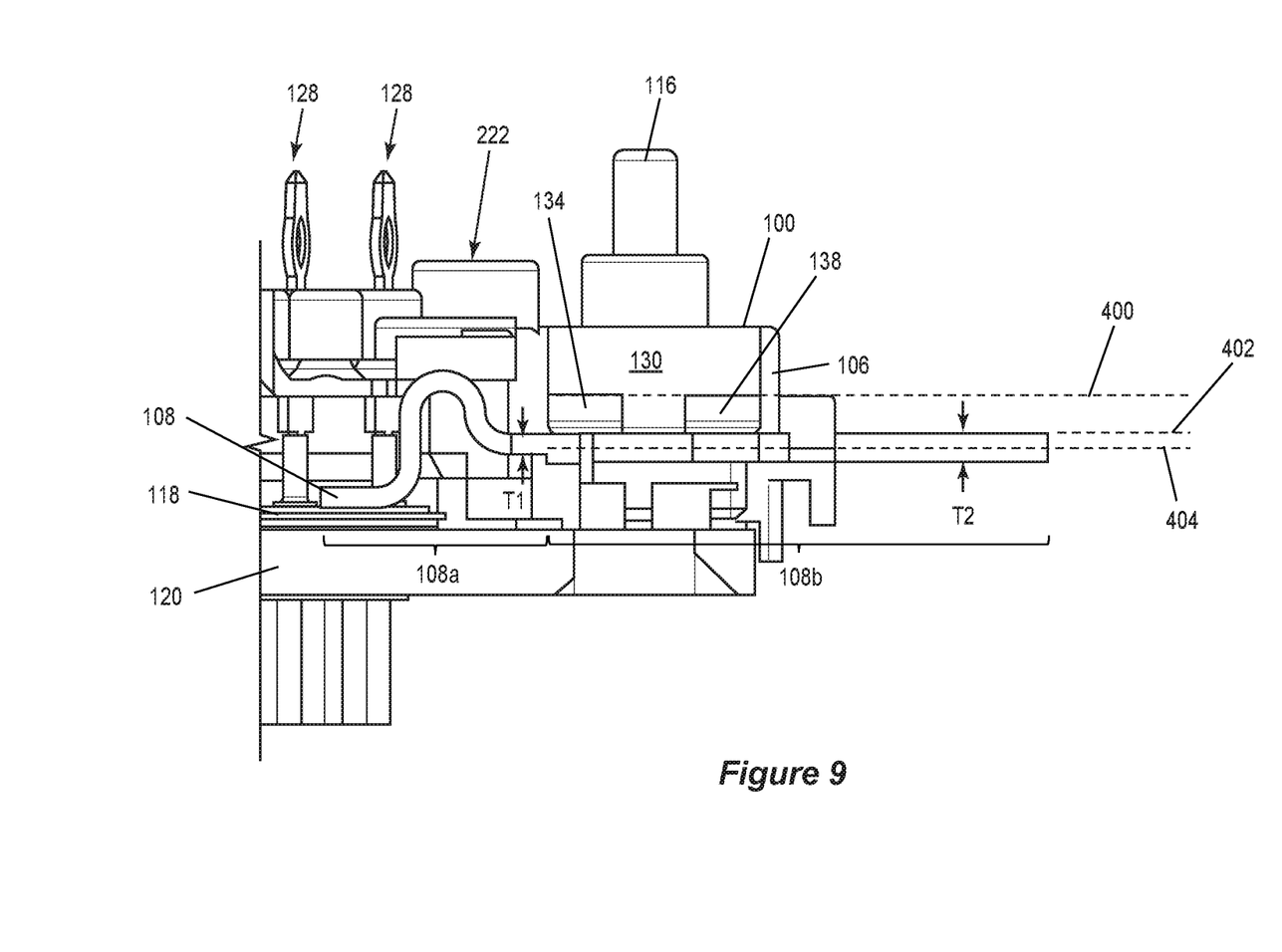
FIG. 9 illustrates a partial cross-sectional view of an embodiment of a power semiconductor module having a rotation bar feature and where a phase busbar of the module is dual gauge.

FIG. 9 illustrates a partial cross-sectional view of an embodiment of the power semiconductor module where the illustrated phase busbar 108 is dual gauge. That is, the phase busbar 108 has two (2) different thicknesses. The phase busbar 108 has a first thickness 'T1' from the corresponding substrate 118 to the receptacle 130 and a second thickness 'T2' from the receptacle 130 to beyond the border wall 106 of the power module frame 100. The second thickness T2 is greater than the first thickness T1. For example, T1=1 mm and T2=1.5 mm. The thinner part 108a of the phase busbar 108 provides for lower mechanical stress, e.g., during ultrasonic welding to the substrate 118 and better decoupling of thermo-mechanic forces to a ceramic material of the substrate 118. The thicker part 108a of the phase busbar 108 provides for lower resistance and thus heating.

Horizontal dashed line 400 in FIG. 9 indicates the axis of rotation provided by the first rotation bar 134 (and second rotation bar 138, if used), and which serves as a distance keeper for the current sensor module 204 if the current sensor module 204 contacts the first rotation bar 134 (and second rotation bar 138, if used) during the power electronic assembly process. Horizontal dashed line 402 in FIG. 9 indicates an external mounting/attachment surface of the phase busbar 108 outside the module frame 100. Horizontal dashed line 404 in FIG. 9 indicates the horizontal center line of the phase busbar 108, which is a key point of reference for differential Hall current sensing. If the current sensor module 204 employs differential Hall current sensing, the differential Hall sensors 212a, 212b should be positioned above and below, respectively, the phase busbar 108 to ensure minimal stray field interference. As explained previously herein with reference to FIG. 5, the thickness T_bar of the first rotation bar 134 (and second rotation bar 138, if used) may be chosen to ensure proper positioning of the differential Hall sensors 212a, 212b.

Although the present disclosure is not so limited, the following numbered examples demonstrate one or more aspects of the disclosure.

Example 1. A power semiconductor module, comprising: an electrically insulative frame having a first mounting side, a second mounting side opposite the first mounting side, and a border wall that defines a periphery of the electrically insulative frame; a first substrate seated in the electrically insulative frame; a plurality of power semiconductor dies attached to the first substrate; a plurality of signal pins attached to the first substrate and electrically connected to the power semiconductor dies; a busbar attached to the first substrate and extending through the border wall; a receptacle in the border wall configured to receive a current sensor module and that exposes part of the busbar, the exposed part of the busbar having an opening; and a first rotation bar jutting out from a first sidewall of the receptacle and onto the exposed part of the busbar without obstructing the opening in the busbar, wherein the first rotation bar forms an axis of rotation within the receptacle.

Example 2. The power semiconductor module of example 1, wherein the first rotation bar extends to a second sidewall of the receptacle opposite the first sidewall such that the first rotation bar is uninterrupted between the first sidewall and the second sidewall.

Example 3. The power semiconductor module of example 1, further comprising: a second rotation bar jutting out from a second sidewall of the receptacle opposite the first sidewall and onto the exposed part of the busbar without obstructing the opening in the busbar, wherein the first rotation bar and the second rotation bar are aligned with one another, wherein a gap is present between the first rotation bar and the second rotation bar, wherein the second rotation bar forms part of the same axis of rotation as the first rotation bar.

Example 4. The power semiconductor module of example 3, wherein the first rotation bar has a proximal end adjoining the first sidewall and a distal end facing the second rotation bar, wherein the second rotation bar has a proximal end adjoining the second sidewall and a distal end facing the first rotation bar, wherein the proximal end of the first rotation bar is wider than the distal end of the first rotation bar, and wherein the proximal end of the second rotation bar is wider than the distal end of the second rotation bar.

Example 5. The power semiconductor module of example 3 or 4, wherein the gap is in a range of 1 mm to 4 mm.

Example 6. The power semiconductor module of any of examples 3 through 5, wherein the gap is in a range of 13% to 52% of the distance between the first sidewall and the second sidewall.

Example 7. The power semiconductor module of any of examples 1 through 6, wherein the first rotation bar has a thickness in a range of 0.7 mm to 4 mm.

Example 8. The power semiconductor module of any of examples 1 through 7, wherein the electrically insulative frame comprises plastic, and wherein the first rotation bar is a protrusion of the plastic jutting out from the first sidewall of the receptacle.

Example 9. The power semiconductor module of any of examples 1 through 8, further comprising: a metal base plate attached to the first mounting side of the electrically insulative frame, wherein the metal base plate has an opening aligned with the receptacle in the border wall.

Example 10. The power semiconductor module of example 9, wherein the receptacle has a solid bottom that is exposed by the opening in the metal base plate.

Example 11. The power semiconductor module of any of examples 1 through 10, wherein the busbar has a first thickness from the first substrate to the receptacle and a second thickness from the receptacle to beyond the border wall, and wherein the second thickness is greater than the first thickness.

Example 12. A power electronic assembly, comprising: a power semiconductor module comprising an electrically insulative frame having a border wall that defines a periphery of the electrically insulative frame, a busbar extending through the border wall, a receptacle in the border wall that exposes part of the busbar, the exposed part of the busbar having an opening, and a first rotation bar jutting out from a first sidewall of the receptable and onto the exposed part of the busbar without obstructing the opening; a metal base plate attached to a first mounting side of the power semiconductor module; a circuit board attached to a second mounting side of the power semiconductor module opposite the first mounting side; and a current sensor module seated in the receptacle in the border wall of the power semiconductor module, wherein a part of the current sensor module extends through the opening in the busbar, wherein the first rotation bar forms an axis of rotation for the current sensor module.

Example 13. The power electronic assembly of example 12, wherein the first rotation bar extends to a second sidewall of the receptacle opposite the first sidewall such that the first rotation bar is uninterrupted between the first sidewall and the second sidewall.

Example 14. The power electronic assembly of example 12, further comprising: a second rotation bar jutting out from a second sidewall of the receptacle opposite the first sidewall and onto the exposed part of the busbar without obstructing the opening in the busbar, wherein the first rotation bar and the second rotation bar are aligned with one another, wherein a gap is present between the first rotation bar and the second rotation bar, wherein the second rotation bar forms part of the same axis of rotation as the first rotation bar.

Example 15. The power electronic assembly of example 14, wherein the first rotation bar has a proximal end adjoining the first sidewall and a distal end facing the second rotation bar, wherein the second rotation bar has a proximal end adjoining the second sidewall and a distal end facing the first rotation bar, wherein the proximal end of the first rotation bar is wider than the distal end of the first rotation bar, and wherein the proximal end of the second rotation bar is wider than the distal end of the second rotation bar.

Example 16. The power electronic assembly of any of examples 12 through 15, wherein the current sensor module has a standoff that contacts the exposed part of the busbar, and wherein the standoff is thicker than the first rotation bar such that the current sensor module does not contact the first rotation bar.

Example 17. The power electronic assembly of any of examples 12 through 16, wherein the metal base plate has an opening aligned with the receptacle in the border wall.

Example 18. The power electronic assembly of example 17, wherein the receptacle has a solid bottom that is exposed by the opening in the metal base plate.

Example 19. The power electronic assembly of any of examples 12 through 18, wherein the current sensor module contacts the first rotation bar.

Example 20. The power electronic assembly of example 19, wherein the current sensor module is a differential current sensor module comprising a first Hall sensor and a second Hall sensor, and wherein a thickness of the first rotation bar is proportional to a thickness of the busbar such that the first Hall sensor is positioned above the busbar and the second Hall sensor is positioned below the busbar.

Example 21. A method of producing a power electronic assembly, the method comprising: pre-oi-g providing a power semiconductor module comprising an electrically insulative frame having a border wall that defines a periphery of the electrically insulative frame, a busbar extending through the border wall, a receptacle in the border wall that exposes part of the busbar, the exposed part of the busbar having an opening, and a first rotation bar jutting out from a first sidewall of the receptacle and onto the exposed part of the busbar without obstructing the opening; attaching a metal base plate to a first mounting side of the power semiconductor module; and attaching a circuit board with a current sensor module to a second mounting side of the power semiconductor module opposite the first mounting side, wherein attaching the circuit board comprises inserting the current sensor module into the receptacle in the border wall of the power semiconductor module such that a part of the current sensor module extends through the opening in the busbar, wherein the current sensor module is free to rotate about an axis of rotation formed by the first rotation bar during the inserting.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
   an electrically insulative frame having a first mounting side, a second mounting side opposite the first mounting side, and a border wall that defines a periphery of the electrically insulative frame;
   a first substrate seated in the electrically insulative frame;
   a plurality of power semiconductor dies attached to the first substrate;
   a plurality of signal pins attached to the first substrate and electrically connected to the power semiconductor dies;
   a busbar attached to the first substrate and extending through the border wall;
   a receptacle in the border wall configured to receive a current sensor module and that exposes part of the busbar, the exposed part of the busbar having an opening; and
   a first rotation bar jutting out from a first sidewall of the receptacle and onto the exposed part of the busbar without obstructing the opening in the busbar,
   wherein the first rotation bar forms an axis of rotation within the receptacle.

2. The power semiconductor module of claim 1, wherein the first rotation bar extends to a second sidewall of the receptacle opposite the first sidewall such that the first rotation bar is uninterrupted between the first sidewall and the second sidewall.

3. The power semiconductor module of claim 1, further comprising:
a second rotation bar jutting out from a second sidewall of the receptacle opposite the first sidewall and onto the exposed part of the busbar without obstructing the opening in the busbar,
wherein the first rotation bar and the second rotation bar are aligned with one another,
wherein a gap is present between the first rotation bar and the second rotation bar,
wherein the second rotation bar forms part of the same axis of rotation as the first rotation bar.

4. The power semiconductor module of claim 3, wherein the first rotation bar has a proximal end adjoining the first sidewall and a distal end facing the second rotation bar, wherein the second rotation bar has a proximal end adjoining the second sidewall and a distal end facing the first rotation bar, wherein the proximal end of the first rotation bar is wider than the distal end of the first rotation bar, and wherein the proximal end of the second rotation bar is wider than the distal end of the second rotation bar.

5. The power semiconductor module of claim 3, wherein the gap is in a range of 1 mm to 4 mm.

6. The power semiconductor module of claim 3, wherein the gap is in a range of 13% to 52% of the distance between the first sidewall and the second sidewall.

7. The power semiconductor module of claim 1, wherein the first rotation bar has a thickness in a range of 0.7 mm to 4 mm.

8. The power semiconductor module of claim 1, wherein the electrically insulative frame comprises plastic, and wherein the first rotation bar is a protrusion of the plastic jutting out from the first sidewall of the receptacle.

9. The power semiconductor module of claim 1, further comprising:
a metal base plate attached to the first mounting side of the electrically insulative frame,
wherein the metal base plate has an opening aligned with the receptacle in the border wall.

10. The power semiconductor module of claim 9, wherein the receptacle has a solid bottom that is exposed by the opening in the metal base plate.

11. The power semiconductor module of claim 1, wherein the busbar has a first thickness from the first substrate to the receptacle and a second thickness from the receptacle to beyond the border wall, and wherein the second thickness is greater than the first thickness.

12. A power electronic assembly, comprising:
a power semiconductor module comprising an electrically insulative frame having a border wall that defines a periphery of the electrically insulative frame, a busbar extending through the border wall, a receptacle in the border wall that exposes part of the busbar, the exposed part of the busbar having an opening, and a first rotation bar jutting out from a first sidewall of the receptacle and onto the exposed part of the busbar without obstructing the opening;
a metal base plate attached to a first mounting side of the power semiconductor module;
a circuit board attached to a second mounting side of the power semiconductor module opposite the first mounting side; and
a current sensor module seated in the receptacle in the border wall of the power semiconductor module,
wherein a part of the current sensor module extends through the opening in the busbar,
wherein the first rotation bar forms an axis of rotation for the current sensor module.

13. The power electronic assembly of claim 12, wherein the first rotation bar extends to a second sidewall of the receptacle opposite the first sidewall such that the first rotation bar is uninterrupted between the first sidewall and the second sidewall.

14. The power electronic assembly of claim 12, further comprising:
a second rotation bar jutting out from a second sidewall of the receptacle opposite the first sidewall and onto the exposed part of the busbar without obstructing the opening in the busbar,
wherein the first rotation bar and the second rotation bar are aligned with one another,
wherein a gap is present between the first rotation bar and the second rotation bar,
wherein the second rotation bar forms part of the same axis of rotation as the first rotation bar.

15. The power electronic assembly of claim 14, wherein the first rotation bar has a proximal end adjoining the first sidewall and a distal end facing the second rotation bar, wherein the second rotation bar has a proximal end adjoining the second sidewall and a distal end facing the first rotation bar, wherein the proximal end of the first rotation bar is wider than the distal end of the first rotation bar, and wherein the proximal end of the second rotation bar is wider than the distal end of the second rotation bar.

16. The power electronic assembly of claim 12, wherein the current sensor module has a standoff that contacts the exposed part of the busbar, and wherein the standoff is thicker than the first rotation bar such that the current sensor module does not contact the first rotation bar.

17. The power electronic assembly of claim 12, wherein the metal base plate has an opening aligned with the receptacle in the border wall.

18. The power electronic assembly of claim 17, wherein the receptacle has a solid bottom that is exposed by the opening in the metal base plate.

19. The power electronic assembly of claim 12, wherein the current sensor module contacts the first rotation bar.

20. The power electronic assembly of claim 19, wherein the current sensor module is a differential current sensor module comprising a first Hall sensor and a second Hall sensor, and wherein a thickness of the first rotation bar is proportional to a thickness of the busbar such that the first Hall sensor is positioned above the busbar and the second Hall sensor is positioned below the busbar.

21. A method of producing a power electronic assembly, the method comprising:
providing a power semiconductor module comprising an electrically insulative frame having a border wall that defines a periphery of the electrically insulative frame, a busbar extending through the border wall, a receptacle in the border wall that exposes part of the busbar, the exposed part of the busbar having an opening, and a first rotation bar jutting out from a first sidewall of the receptacle and onto the exposed part of the busbar without obstructing the opening;
attaching a metal base plate to a first mounting side of the power semiconductor module; and attaching a circuit board with a current sensor module to a second mounting side of the power semiconductor module opposite the first mounting side, wherein attaching the circuit board comprises inserting the current sensor module into the receptacle in the border wall of the power semiconductor module such that a part of the current sensor module extends through the opening in the busbar, wherein the current sensor module is free to rotate about an axis of rotation formed by the first rotation bar during the inserting.

* * * * *